United States Patent [19]

Storzbach

[11] 3,806,824

[45] Apr. 23, 1974

[54] CENTER FREQUENCY AND BANDWIDTH SELECTION CIRCUIT FOR A FREQUENCY SELECTIVE AMPLIFIER

[75] Inventor: Werner H. Storzbach, Munich, Germany

[73] Assignee: General Electric Company, Lynchburg, Va.

[22] Filed: May 31, 1973

[21] Appl. No.: 365,530

[52] U.S. Cl. .......................... 330/51, 330/85, 330/86, 330/107, 330/110, 330/145

[51] Int. Cl. .................................... H03f 1/36

[58] Field of Search ......... 330/51, 85, 86, 107, 109, 330/110, 145; 328/167

[56] References Cited

UNITED STATES PATENTS

| | | | |
|---|---|---|---|
| 3,743,957 | 7/1973 | Forster | 330/107 X |

*Primary Examiner*—Herman Karl Saalbach
*Assistant Examiner*—James B. Mullins

[57] ABSTRACT

Operational amplifiers are connected in a loop arrangement for providing a frequency selective amplifier. A circuit having any number of selectable resistors of predetermined magnitudes is connected in the loop to permit the selection of any number of center frequencies and bandwidths for the selective amplifier.

2 Claims, 2 Drawing Figures

CENTER FREQUENCY AND BANDWIDTH SELECTION CIRCUIT FOR A FREQUENCY SELECTIVE AMPLIFIER

BACKGROUND OF THE INVENTION

My invention relates to a frequency selective amplifier having operational amplifiers in a loop arrangement, and particularly to a circuit that permits a selection of the center frequency and bandwidth for the frequency selective amplifier.

As shown in an article entitled "State-Variable Synthesis for Insensitive Integrated Circuit Transfer Functions" by W.J. Kerwin, L.P. Huelsman, and R.W. Newcomb, IEEE Journal of Solid-State Circuits, Volume SC-2, Number 3, September 1967, page 87, it is known to use differential input, operational amplifiers in a multiloop feedback configuration to provide a frequency selective amplifier. Because of the differential input required, bipolar symmetrical direct current supplies are required. While this requirement may be tolerable in some applications, it has precluded the use of such frequency selective amplifiers in those applications which have only a unipolar direct current supply of a relatively low voltage available.

Accordingly, a primary object of my invention is to provide an improved frequency selective amplifier whose center frequency and bandwidth can be selected by a new and improved circuit.

Another object of my invention is to provide a new and improved center frequency and bandwidth selection circuit that operates with unipolar direct current at a relatively low voltage to ground.

SUMMARY OF THE INVENTION

Briefly, these and other objects are achieved with a frequency selective amplifier having operational amplifiers connected in a loop arrangement. This arrangement is sometimes known or referred to as an active filter. In many applications, it is necessary or desirable that the center frequency and bandwidth of this frequency selective amplifier or active filter be changed. In accordance with my invention, a plurality of selectively connectable networks are provided at an appropriate point in the loop. Each of these networks has frequency determining and bandwidth determining resistors of a selected magnitude. One of the networks is connected at any one time, and its resistors determine the frequency and bandwidth of the frequency selective amplifier or active filter. The networks are connected by a unipolar direct current voltage of relatively low magnitude, and the operational amplifiers are also utilized in a single input form. These two features permit my selection circuit to be used in those applications having a unipolar direct current voltage of relatively low magnitude.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing in which:

DESCRIPTION OF THE PREFERRED EMBODIMENT

Figure 1:
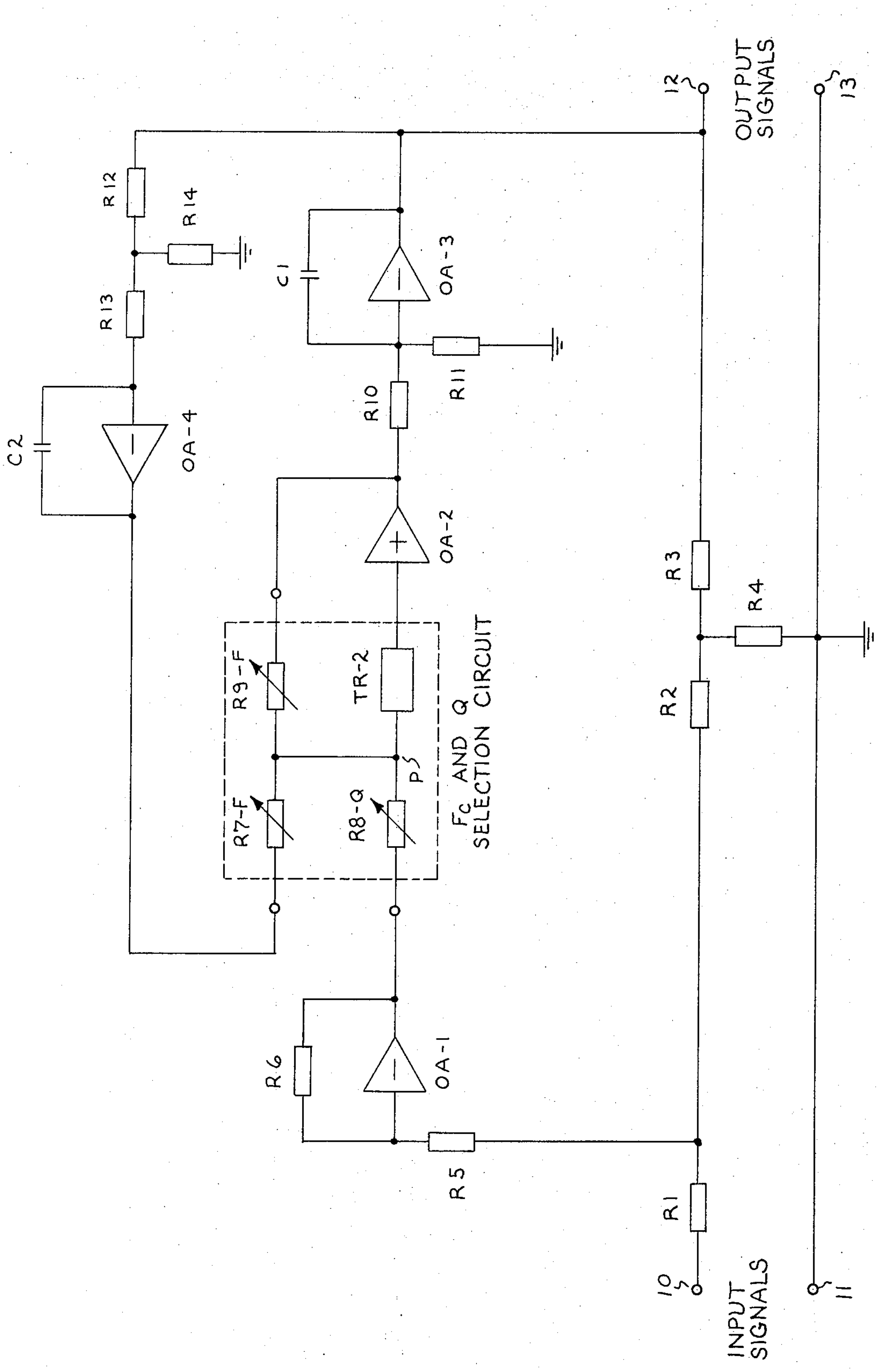
FIG. 1 shows a circuit diagram of a frequency selective amplifier having a center frequency and bandwidth selection circuit in accordance with my invention.

In FIG. 1, I have shown a schematic diagram of a frequency selective amplifier utilizing a selection circuit which sets the center frequency and bandwidth of the amplifier. Such a selective amplifier is desirable in that it provides filtering without the use of inductors, a feature which makes it possible to build the amplifier using microelectronic circuits. In addition, the amplifier has a center frequency and bandwidth selection circuit which permits the center frequency and bandwidth to be varied in a relatively simple manner to meet particular circuit needs. For example, in paging radio receivers, it may be desirable that the center frequency and bandwidth of the amplifier be sequentially changed in order to determine whether a particular sequence of different frequency signals is received. Persons skilled in the art will appreciate, of course, that there are many other uses for this circuit.

With respect to FIG. 1, the input signals to be selected or filtered are applied to input terminals 10, 11 and derived at output terminals 12, 13. The input terminal 10 is coupled through a resistor R1 and a resistor R5 to the negative input of an operational amplifier OA–1. The operational amplifier OA–1 is provided with a feedback resistor R6. The output of the amplifier OA–1 is connected through a center frequency (indicated by $f_c$) and bandwidth (indicated by Q) selection circuit to the positive input of an operational amplifier OA–2. The output of the amplifier OA–2 is connected through a resistor R10 to the negative input of an operational amplifier OA–3. The output of the operational amplifier OA–2 is also provided with a feedback connection to the center frequency and bandwidth selection circuit. The operational amplifier OA–3 has a feedback capacitor C1 and a bias resistor R11. The output of the operational amplifier OA–3 is connected to the output terminal 12. The circuit described thus far forms the forward signal path. In addition, two feedback loops are provided. One loop comprises a T-network having two series resistors R3, R2 and a shunt resistor R4 connected from the output terminal 12 back to the junction of the resistors R1, R5, and a connection from the output terminal 13 to the input terminal 11. These terminals 11, 13 may be connected to a point of reference potential or ground as shown. The other loop comprises a T-network having two series resistors R12, R13, and a shunt resistor R14. The network is connected to the negative input of an operational amplifier OA–4 which is provided with a feedback capacitor C2. The output of the operational amplifier OA–4 is connected to the center frequency and bandwidth selection circuit.

The center frequency and bandwidth selection circuit is indicated by the dashed line rectangle, and comprises a resistor R8–Q which connects the output of the amplifier OA–1 to a common point P. The point P is connected through a phase inverter TR–2 to the positive input of the amplifier OA–2. The circuit further comprises a resistor R7–F which connects the output of the amplifier OA–4 to the point P. And finally, the circuit comprises a resistor R9–F which provides feedback from the output of the amplifier OA–2 back to the point P and the input of that amplifier OA–2. In the selection circuit, the resistors R7–F, R8–Q, R9–F are shown as being variable. Actually, in accordance with my invention, I utilize selectable fixed resistors to change the center frequency and bandwidth of the frequency selective amplifier shown in FIG. 1. In the drawing, the F designation indicates that the resistor changes the center frequency of the circuit, and the Q designation indicates that the resistor changes the bandwidth of the circuit. Thus, the resistors R7–F, R9–F vary the center frequency of the selective amplifier, and the resistor R8–Q varies the bandwidth of the selective amplifier. This selection circuit will be explained in detail in connection with FIG. 2.

Before explaining the selection circuit, the operation of the frequency selective amplifier will be briefly explained. Further details of this amplifier are given in the IEEE article mentioned above. The operational amplifiers shown are provided with a suitable source of direct current (not shown) and are also provided with a connection to the point of reference potential or ground (also not shown). With respect to the amplifiers OA–1, OA–3, OA–4, the input connection is made to the negative input of these amplifiers. The input to the amplifier OA–2 is made to the positive input since the phase inverter TR–2 is provided in the selection circuit. These are indicated by minus and plus signs shown for the amplifiers. It will be appreciated, particularly with respect to the referenced article, that the polarity of the amplifier input that is used, may be varied if the proper circuit relationships are maintained. In the actual embodiment to be described, I have utilized certain resistors to provide factory or manufacturing adjustments to the circuit. Specifically, the resistors R5, R6 may be trimmed or adjusted to provide the desired bandwidth characteristics; the resistors R13, R14 may be trimmed or adjusted to provide the desired center frequency characteristics; and the resistors R3, R4 may be adjusted or trimmed to provide the desired gain characteristics. For a fixed or selected value of the selection circuit resistors R7–F, R8–Q, R9–F, the frequency selective amplifier shown in FIG. 1 will pass signal frequencies having a predetermined or preselected center frequency and bandwidth. It is this center frequency and bandwidth which it is desirable to make selectable or variable. In accordance with my invention, the selection circuit achieves this selectivity or variation through the resistors R7–F, R8–Q, R9–F.

Figure 2:
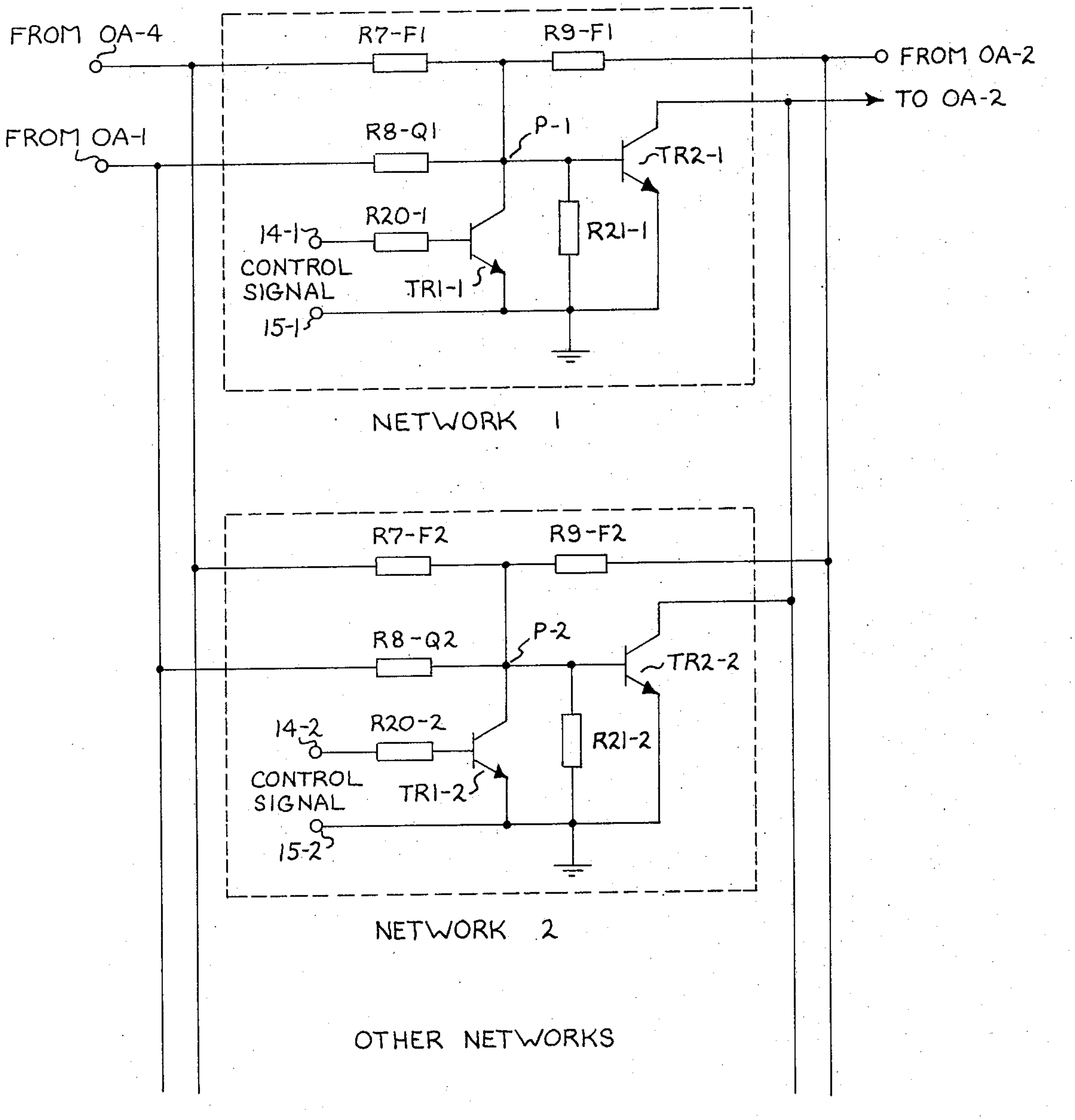
FIG. 2 shows a schematic diagram of one embodiment, in accordance with my invention, of two connectable networks that form the center frequency and bandwidth selection circuit of FIG. 1.

The selection circuit of FIG. 1 is shown in one detailed embodiment in FIG. 2. In the embodiment of FIG. 2, I have assumed that it is desired that two selections be provided, namely a center frequency of F1 with a bandwidth designated Q1 or a center frequency F2 with a bandwidth Q2. However, it is to be understood that additional networks can be provided, the exact center frequency and bandwidth being determined by the magnitude of the selected ones of the resistors R7–F, R8–Q, R9–F. In FIG. 2, the output from the amplifier OA–4 is applied to both resistors R7–F1, R7–F2. The output from the amplifier OA–1 is applied to the resistors R8–Q1, R8–Q2. The feedback from the amplifier OA–2 is applied to the resistors R9–F1, R9–F2. Whether one set or the other set of these resistors is connected to the input of the amplifier OA–2 is determined by whether a transistor TR1–1 or a transistor TR1–2 is made nonconductive. It will be seen the the collector-emitter paths of the transistors TR1–1, TR1–2 are connected between the junctions or common points P–1, P–2 of the three resistors in their respective networks and a point of reference potential or ground. When one of these transistors TR1–1, TR1–2 conducts, it short-circuits the resistors. Hence, only the signals provided by those resistors which are not short-circuited are effectively connected to the operational amplifier OA–2. The short-circuit conditions are determined by a unipolar direct current control signal applied to network terminals 14–1, 15–1 or 14–2, 15–2. If a positive control signal is applied, the respective one of the transistors TR1–1, TR1–2 is conductive to short-circuit its associated resistors. If a zero control signal is applied, the respective one of the transistors TR1–1, TR1–2 is nonconductive so that its resistors can provide signals to the amplifier OA–2. The signals which are not short-circuited are applied to the respective one of the transistors TR2–1, TR2–2. These transistors TR2–1, TR2–2 amplify and phase invert the signals and apply them to the operational amplifier OA–2.

It will thus be seen that I have provided a new and improved center frequency and bandwidth selection circuit for use with operational amplifiers connected as a frequency selective amplifier. The advantage of my circuit is that it utilizes only solid state devices and resistors, along with the advantageous features of operational amplifiers requiring only resistors and capacitors. No inductors are required in my selection circuit and the associated frequency selective amplifier. Hence, relatively small circuits can be produced in large quantities with all of the associated advantages. And it will be seen with respect to my circuit of FIG. 2, that any number of networks can be provided, each network having its particular associated resistive values that provide the desired center frequency and bandwidth characteristics. And, all but one of the networks is provided with a positive signal, which short-circuits the associated resistors. Only the network which is desired to be selected is provided with a zero or low voltage signal. Thus, any type of selecting arrangement and sequencing can be provided by a unipolar direct current voltage of relatively low and unregulated magnitude. A number of different center frequency and bandwidth selection circuits have been built in accordance with my invention, one having as many as eight networks which permit the selection of eight different center frequencies and bandwidths. Because of the nature of the operational amplifiers and the circuit design, the center frequencies may be very close together. With proper adjustment of the resistors R21–1, R21–2 in the selection circuit, the band of center frequencies may be two octaves wide. In the particular embodiment constructed as shown in FIGS. 1 and 2, the various circuit components had the following values:

| Component | Magnitude or Description |
|---|---|
| Resistor R1 | 100,000 ohms |
| Resistor R2 | 56,000 ohms |
| Resistor R3 | 75,000 ohms |
| Resistor R4 | 4,200 ohms |
| Resistor R5 | 10,000 ohms |
| Resistor R6 | 11,250 ohms |
| Resistor R7-F1 | 38,310 ohms |
| Resistor R7-F2 | 10,310 ohms |
| Resistor R8-Q1 | 63,290 ohms |
| Resistor R8-Q2 | 52,820 ohms |
| Resistor R9-F1 | 30,000 ohms |
| Resistor R9-F2 | 30,000 ohms |

| | |
|---|---|
| Resistor R10 | 95,000 ohms |
| Resistor R11 | 95,000 ohms |
| Resistor R12 | 6,200 ohms |
| Resistor R13 | 75,000 ohms |
| Resistor R14 | 4,200 ohms |
| Resistor R20-1 | 10,000 ohms |
| Resistor R20-2 | 10,000 ohms |
| Resistor R21-1 | 11,100 ohms |
| Resistor R21-2 | 5,100 ohms |
| Capacitor C1 | 2,000 micromicrofarads |
| Capacitor C2 | 2,000 micromicrofarads |
| Operational Amplifier OA-1 | GE 19A 116957-1 |
| Operational Amplifier OA-2 | GE 19A116957-1 |
| Operational Amplifier OA-3 | GE 19A116957-1 |
| Operational Amplifier OA-4 | GE 19A116957-1 |
| Transistor TR1-1 | GE 19A116826-1 |
| Transistor TR1-2 | GE 19A116826-1 |
| Transistor TR2-1 | GE 19A116826-1 |
| Transistor TR2-2 | GE 19A116826-1 |

With the circuits of FIGS. 1 and 2 having these values, a gain for both networks of 21 dB was provided. A control signal of zero volt was used to select a network, and the other network was kept unselected (that is, the transistor TR1–1 or the transistor TR1–2 kept turned on) by a control signal of 1.5 volts. When the network 1 was selected, the center frequency was 517.5 Hz and the Q was 158. When the network 2 was selected, the center frequency was 997.5 Hz and the Q was 255. This example shows the versatility of the invention, although it is illustrative of a circuit having only two networks. However, as mentioned earlier, almost any number of networks with appropriate resistive values can be provided.

It will thus be seen that my invention provides a new and improved center frequency and bandwidth selection circuit for a frequency selective amplifier using operational amplifiers having only resistors and capacitors. While my invention has been described with reference to only a particular embodiment, it is to be understood that modifications may be made without departing from the spirit of the invention or from the scope of the claims.

What I claim as new and desire to secure by Letters Patent of the United States is:

1. In a filter circuit having input terminals to which signals are applied, output terminals from which a selected band of signals is derived, a first operational amplifier having an input connected to said input terminals and having an output, a second operational amplifier having an input and an output, a third operational amplifier having an input connected to said second operational amplifier output and having an output connected to said output terminals, a fourth operational amplifier having an input connected to said third operational amplifier output and having an output, an improved circuit for selecting the center frequency and bandwidth of said filter comprising:

a plurality of selectively connectable networks connected to said second operational amplifier input and to said outputs of said first, second, and fourth operational amplifiers, each of said networks comprising:

a. a common point;

b. means connecting said common point to said second operational amplifier input;

c. a first bandwidth determining resistor connected between said first operational amplifier output and said common point;

d. a first frequency determining resistor connected between said second operational amplifier output and said common point;

e. a second frequency determining resistor connected between said fourth operational amplifier output and said common point;

f. and means connected to said common point for selectively passing and blocking signals, supplied by said resistors at said common point, to and from said second operational amplifier input.

2. The improved input selecting circuit of claim 1 wherein said passing and blocking means of each of said networks comprises a transistor connected between said common point and a point of reference potential, said transistor being rendered conductive to block said signals from said second operational amplifier input and being rendered non-conductive to pass said signals to said second operational amplifier input.

* * * * *